United States Patent [19]

Greenwood et al.

[11] Patent Number: 5,245,343
[45] Date of Patent: Sep. 14, 1993

[54] ENHANCED ACCURACY DELTA-SIGMA A/D CONVERTER

[75] Inventors: Michael W. Greenwood, Maple Grove; Paul P. DuPuis, Mound, both of Minn.

[73] Assignee: Honeywell Inc., Minneapolis, Minn.

[21] Appl. No.: 562,260

[22] Filed: Aug. 3, 1990

[51] Int. Cl.⁵ .................... H03M 3/02; H03M 1/12
[52] U.S. Cl. ...................... 341/143; 341/166; 341/158
[58] Field of Search .......... 341/143, 165, 166, 167, 341/168, 169, 170, 158, 157; 381/29, 30, 31, 33; 377/42, 118, 130

[56] References Cited

U.S. PATENT DOCUMENTS

| | | | |
|---|---|---|---|
| 3,956,700 | 5/1976 | Condon | 341/143 X |
| 4,009,475 | 2/1977 | DeFreitas | 341/143 |
| 4,071,825 | 1/1978 | McGuffin | 341/143 X |
| 4,156,871 | 5/1979 | Lambourn | 341/143 |
| 4,301,446 | 11/1981 | Petit | 341/143 |
| 4,411,003 | 10/1983 | Su | |
| 4,796,004 | 1/1989 | Rich et al. | |
| 4,855,745 | 8/1989 | Smither | |
| 4,860,012 | 8/1989 | Rich et al. | |
| 4,873,700 | 10/1989 | Wong | |
| 4,918,454 | 4/1990 | Early et al. | |
| 4,937,577 | 6/1990 | Rich et al. | |

OTHER PUBLICATIONS

DSPatch newsletter No. 15 spring 1990 entitled "The ADSP-21msp50: A New Class of Mixed-Signal Processor".
EDN article entitled High-resolution A/D converters by Anne Watson Swager, Associate Editor Aug. 3, 1989.
Crystal Semiconductor Corporation data sheet for the CS5501 Low-Cost, 16-Bit Measurement A/D Converter.
Electronic Design magazine article entitled "Through Continuous Integration, V-F Converter Raises Accuracy of Comulative Measurements", IEEE Transaction on Communication vol. COM-29, No. 9 Sep. 1981.
"The Structure of Quantization Noise from Sigma-Delta Modulation" Electronic Design magazine article entitled Resolve 22 Bits Easily With Charge-Balance ADCs.

Primary Examiner—Sharon D. Logan
Attorney, Agent, or Firm—Ronald E. Champion

[57] ABSTRACT

A delta-sigma modulator is provided with a multi-stage shift register coupled to receive as its input the output from a quantizer including an analog integrator. The serial digital output signal train from the shift register is fed back to the input of the integrator and because of the frequency division which takes place, for a given high clock rate, an operational amplifier with a lower gain/-bandwidth product may be employed. The invention also includes a signal processor coupled to the output of the delta sigma modulator and which is arranged to provide an adaptive window based, decimation cycle whose exact timing is data dependent. The adaptive windowing process implemented in a microprocessor-based signal processor allows the first occurrence of a proper polarity state transition occurring during a window period to become the termination point of the computation cycle rather than providing a fixed time interval. By doing so, the effective resolution can be increased by an order of magnitude for a predetermined duty cycle.

5 Claims, 7 Drawing Sheets ial digital electronic systems employ one, the scope of this invention is not limited to such an interface.

ENHANCED ACCURACY DELTA-SIGMA A/D CONVERTER

BACKGROUND OF THE INVENTION

I. Field of the Invention

This invention relates generally to a method of implementing the hardware and processing the resultant output data of a delta-sigma analog to digital (A/D) converter. The manner by which this is accomplished improves the resolution, accuracy, dynamic range, noise level, and conversion speed while reducing the hardware requirements and cost significantly.

II. Discussion of the Prior Art

Delta-sigma A/D converters are a class of A/D converters characterized by their extremely simple quantizer design. The quantizer within a $\Delta$-$\Sigma$ A/D converter provides an output signal having only one bit of resolution. To achieve the desired resolution, many sequential output samples from the quantizer are averaged or processed by other digital means. The primary advantage of $\Delta$-$\Sigma$ A/D converters is their analog simplicity. It makes them exceptionally linear, small, and insensitive to component tolerance variations, all of which makes them easy to integrate within a mostly digital integrated circuit.

A simple $\Delta$-$\Sigma$ A/D converter typically comprises a first operational amplifier having the analog input to be converted applied to its non-inverting input and a reference voltage applied through an electronic switch to its inverting input. A feedback capacitor couples the output of this operational amplifier back to its inverting input and, as such, the combination functions as an analog integrator. The output of the integrator circuit is then effectively coupled to the data input of a D-type flip-flop which is clocked at a predetermined rate. When the output from the integrator exceeds the threshold established for the D-input of the flip-flop, a logical "1" output will appear at its output terminal at the time that a clock signal is applied to the clock input of that D-type flip-flop. The output from the flip-flop comprises a serial digital data output stream and that output data stream is also effectively applied to the inverting input of the op-amp integrator.

To date, $\Delta$-$\Sigma$ A/D converters have found applications mainly in the telecommunications and digital audio field. The most prevalent application of this is in compact disc "CD" players. Other applications of this technology have been in video digitization for combined audio-video telephone service. More limited use of the $\Delta$-$\Sigma$ A/D conversion has been made in applications requiring accurate measurement of DC and low frequency AC signals riding a DC component.

Prior art $\Delta$-$\Sigma$ A/D converters are characterized by a source of analog information which is fed into a $\Delta$-$\Sigma$ A/D quantizer which converts the analog data into a "density" modulated serial digital data stream, and subsequent digital processing of that data to arrive at a meaningful output. Within the quantizer, there are one or more stages of analog integration, which corresponds to the "order" of the quantizer. This is followed by a single stage digital delay element, typically, a latch, which provides the output from the quantizer as well as a portion of the feedback signal for the quantizer.

The output of the quantizer in prior art $\Delta$-$\Sigma$ A/D converters has been processed in a number of ways including decimation, averaging, and digital filtering to arrive at a usable signal. These methods have been used in various combinations and have been combined with weighting of the decimated samples and dithering to improve the attainable resolution (and hence the ultimately realizable accuracy and signal-to-noise ratio) and conversion speed.

Although there are many advantages to implementing the $\Delta$-$\Sigma$ A/D conversion process over more conventional A/D conversion processes, such as flash and successive approximation, the prior art methods of $\Delta$-$\Sigma$ A/D conversion unfortunately suffer from a much longer data latency than can be tolerated in many applications, most notably in control systems.

A goal of prior art $\Delta$-$\Sigma$ A/D converters has always been to arrive at a means of configuring a $\Delta$-$\Sigma$ quantizer and processing its serial output to achieve the highest resolution, and hence best dynamic range, in the shortest possible time, thereby maximizing the frequency response. The present invention extends that state of the art.

This invention is based on $\Delta$-$\Sigma$ A/D conversion principles, however, the implementation of the hardware and data reduction process have been modified to provide a significant advance in terms of cost reduction through the ability to use components having lower gain/bandwidth characteristics and in terms of increased accuracy. It is those hardware modifications and the new output data reduction implementation which are the focus of this invention.

OBJECTS

It is the overall object of this invention to enable a $\Delta$-$\Sigma$ A/D converter to convert an analog signal into a digital signal of finite precision within a shorter period of time (thereby extending the utility of the invention to latency-critical applications) and with a minimal amount of circuitry; said circuitry being minimized in a manner which provides stable long-term accuracy of the conversion process and a minimum-cost implementation.

Other objectives of the present invention are to provide an improved method of $\Delta$-$\Sigma$ A/D conversion which:

1. With any given $\Delta$-$\Sigma$ quantizer implementation shortens the time required to attain a given accuracy, thereby maximizing the frequency response by providing less latency and making this technique particularly valuable for control systems application.

2. Provides a wider dynamic range and, hence, a better signal-to-noise ratio without a proportional increase in conversion time than prior art $\Delta$-$\Sigma$ A/D converters. In essence, this invention results in a conversion process which is characterized as having a "percentage-of-point" accuracy which is a function of the duty cycle compared to the more common "percentage-of-full-scale" accuracy specification (expressed in least significant bits or LSBs) associated with other A/D converter implementations, including prior-art $\Delta$-$\Sigma$ A/D converters.

3. Provides an output which is directly interfaceable with standard microcontroller, e.g. Intel 8051. While the preferred embodiment will be described in the context of it being used with a microcontroller (or microprocessor) since most modern digital electronic systems employ one, the scope of this invention is not limited to such an interface.

4. Simplifies the hardware mechanization compared to the prior art since it does not require a complex hardware-based digital filter following the Δ-Σ quantizer to attain similar performance. A simple, minimal latency software-based digital filter will suffice if one is desired at all. This reduces the cost compared to prior art systems.

5. Minimizes the analog complexity of the Δ-Σ quantizer, thereby resulting in a more stable system. This invention only requires a first-order Δ-Σ A/D architecture, but does not preclude the use of higher ordered quantizers.

6. Places less demands on the op amp used to implement the integration of the analog input signal for a high gain bandwidth product. This allows a slower, less costly or more realizable op amp to suffice.

7. Has less sensitivity to parasitic circuit elements because of the reduced frequency spectrum in the digital feedback path. This reduction in error sources makes more accurate conversions possible.

8. Extracts both duty cycle "density" information and inter-bit phasing information in a single decimation cycle without the need for a subsequent digital filter. It thereby results in a more precise measurement in a shorter period of time.

It is still a further object of the present invention are to provide an improved method of Δ-Σ A/D conversion which with any given Δ-Σ quantizer implementation shortens the time required to attain a given accuracy, thereby maximizing the frequency response by providing less latency and making this technique particularly valuable for control systems application.

It is yet a further object of the present invention to provide an improved method of Δ-Σ A/D conversion which provides a wider dynamic range and, hence, a better signal-to-noise ratio, without a proportional increase in conversion time than prior art Δ-Σ A/D converters. In essence, this invention results in a conversion process which is characterized as having a fixed "percentage-of-point" accuracy compared to the more common "percentage-of-full-scale" accuracy specification (expressed in least significant bits or LSBs) associated with other A/D converter implementations, including prior-art Δ-Σ A/D converters.

Yet another object of the present invention is to provide an improved method of Δ-Σ A/D conversion which provides an output which is directly interfaceable with standard microcontrollers (e.g. Intel 8051). While the preferred embodiment will be described in the context of it being used with a microcontroller (or microprocessor) since most modern digital electronic systems employ one, the scope of this invention is not limited to such an interface.

A still further object the present invention is to provide an improved method of Δ-Σ A/D conversion which simplifies the hardware mechanization compared to the prior art since it does not require a complex hardware-based digital filter following the Δ-Σ quantizer to attain similar performance. A simple, minimal latency software-based digital filter will suffice if one is desired at all. This reduces the cost compared to prior art systems.

It is another object of the present invention to provide an improved method of Δ-Σ A/D conversion which minimizes the analog complexity of the Δ-Σ quantizer, thereby resulting in a more stable system. This invention only requires a first-order Δ-Σ A/D architecture, however, Δ-Σ A/D converters employing higher order quantizers will benefit similarly.

It is a further object of the present invention to provide an improved method of Δ-Σ A/D conversion which places less demands on the op amp used to implement the integration of the analog input signal for a high gain bandwidth product. This allows a slower, less costly or more realizable op amp to suffice.

It is a further object of the present invention are to provide an improved method of Δ-Σ A/D conversion which extracts both duty cycle "density" information and inter-bit phasing information in a single decimation cycle without the need for a subsequent digital filter. The method thereby results in a more precise measurement in a shorter period of time.

It is another object of the invention to provide a highly accurate delta-sigma modulation technique that utilizes an adaptive counting window.

It is a further object of the invention to provide a method of reducing the slew rate of an operational amplifier used in a delta-sigma modulator.

It is another object of the invention to provide an highly accurate analog digital converter using a Δ-Σ modulation technique with a signal processor to perform the analog digital conversion with real time analog input signals.

The means by which the previous objectives are achieved are the objects of this invention. These objects should be used in concert to achieve the full benefits of this invention, however, they may also be used singly with a corresponding degradation in performance.

SUMMARY OF THE INVENTION

In accordance with this invention, the above-described objects are achieved by modifying the prior art Δ-Σ quantizer to include multiple clocked shift register stages between the integrator and the serial digital data output point. The function of the multiple stages is to allow use of a high clock frequency for clocking the shift register while keeping the frequency of the digital signals fed back to the switch at a sufficiently low value so that the integrator performance will not be adversely degraded by the finite gain/bandwidth product of the op-amp of the integrator. A high clock frequency is directly proportional to output accuracy. The timing boundaries on which the output of the shift register chain may transition have a resolution of 1/X seconds where X is the clock frequency in Hz. This is similar to that in the prior art arrangement, however, the digital feedback frequency is reduced in direct proportion to the number of shift register stages utilized. For example, with only a single D-type flip-flop coupled between the integrator and the serial digital data output line, the maximum digital feedback frequency is X/2. In accordance with this invention, the maximum digital feedback frequency to the electronic switch is X/(2N) where N is the number of shift register stages. The digital feedback frequency of the present invention and, hence, the gain/bandwidth product requirement for the integrating op amp are both reduced in inverse proportion to the number of shift register stages in the forward path.

It is another feature of this invention that a means is provided by which the output data contained within the serial digital data output from the Δ-Σ quantizer may be reduced to a highly accurate result in a single decimation cycle without requiring subsequent digital filtering to attain such high precision. (Digital filtering may, however, be used for additional frequency shaping if desired for the end application.) The means by which this is accomplished is through the use of a non-fixed, slightly variable decimation cycle whose exact timing is data dependent. The timing uses a "windowing" process and is synchronized to state changes in the $\Delta$-$\Sigma$ quantizers serial output data. This "slightly variable" decimation cycle is based on a fixed cycle time $T_0$ to $T_1$ as shown in FIG. 5 with a small "window" from $T_1$ to $T_2$ on the end. The first occurrence of a proper polarity state transition occurring during the window will become the time $T_2$ reference point and the relative time of occurrence of this event is "noted". All subsequent occurrences of state transitions emanating from the $\Delta$-$\Sigma$ quantizer within the window, but not its absolute state, are ignored. Beginning at time $T_0$, the accumulation of the total time that the $\Delta$-$\Sigma$ quantizer's serial digital output is in the "1" state begins. At the end of the fixed interval, at time $T_1$, the "window" is opened. During this window, the first occurrence of a proper polarity state transition will again be looked for. When one occurs, that is defined as time $T_2$. Time $T_2$ is noted and all subsequent state transitions within that window will be ignored. The total amount of time the $\Delta$-$\Sigma$ quantizer's output spent in the "1" state between times $T_0$ to $T_2$ is then noted. This measurement is termed "1 states". The difference in time of occurrence between $T_0$ to $T_2$ are also determined by the time difference between the two noted values. This is termed "$\Delta$Time". The value "1 states" is then divided by "$\Delta$Time" with the result being an enhanced resolution measurement. The key element here is that the period is not rigidly constrained to be a fixed time but is allowed some leeway to naturally synchronize with variations in the $\Delta$-$\Sigma$ quantized data. By allowing the "$\Delta$Time" term, i.e., the denominator, to vary slightly, an effective time "vernier" is realized in the measurement. This is most easily illustrated by the following simplified example. Given an elementary $\Delta$-$\Sigma$ quantizer, such as is shown in FIG. 2, let it be assumed that a decimation cycle is equal in time to 100 clock cycles. The step-wise resolution of the output if processed using a conventional prior art method will be 1 part in 100 or 1%, i.e., slewing up from 9% to 11% duty cycle, the output steps will be 9 "1's" accumulated out of a possible full scale range of 100 or 9/100=9%, then 10/100=10%, and then 11/100=11%. Still using the same hardware configuration of the prior art arrangement of FIG. 2 for consistency, and slewing over the same range, the data processing method embodied in this invention will follow the following numerical sequence: 9/10=9%, 9/99=9.09%, 9/98=9.18%, 9/97=9.28%, 9/96=9.38%, 9/95=9.47%, 9/94=9.57%, 9/93=9.68%, 9/92=9.78%, 9/91=9.89%, 9/90=10%=10/100, 10/99=10.10% 10/98=10.20%, 10/97=10.31%, 10/96=10.42%, 10/95=10.53%, 10/94=10.64%, 10/93=10.75%, 10/92=10.87%, 10/91=10.99%=11/100=11%. Note how the denominator which is equal to the measurement interval is allowed to vary slightly; in this case from 90 to 100. From this sequence, it is evident that the discernable resolution has been improved by about an order of magnitude between the two methods at this particular operating point. The prior art implementation only resolved two steps between 9% and 11% duty cycle, while the method of the present invention is able to resolve 19 steps between the same two points with less than half a bit of differential non-linearity even at the improved resolution. The actual resolution improvement and differential non-linearity are functions of the duty cycle operating point and the base value of the denominator term (base period) and allowed deviation (windowing period). These details are elaborated on further in the detailed description of the preferred embodiment.

A good description of the behavior and structure of delta-sigma modulators used in analog-to-digital conversion is contained in an article titled "Delta Modulators Simplify A/D Conversion" written by Barry Harvey of Elantec, Inc. in the Jun. 22, 1989 issue of *Electronics Design News*, Pages 175–184. Quoting from his article:

Delta modulators perform only one bit (an unweighted bit) of digital conversion per clock cycle out of the maximum $2^{n-1}$ possible counts of an n-bit digital word. A delta modulator therefore requires $2^n$ clock cycles to complete a full scale A/D conversion. Fortunately, because of their hardware simplicity, delta modulators can run on fast clocks. Although a delta modulator performs many of the same functions as an integrating A/D converter, a delta modulator's output is useful even in the middle of the $2^n$ possible counts. Like a tracking A/D converter, a delta modulator attempts to keep a valid running total of the analog input.

To successfully implement a delta modulator requires a highly accurate time based counting mechanism. An inaccuracy of one digital bit in the counting mechanism results in a halving of the total accuracy of the delta modulation system. The present invention provides an improved accuracy time based counting mechanism that also provides for increased resolution through an adaptive counting window.

Time based counting methods can be implemented either in dedicated hardware or as software either running in a standard microprocessor or a special purpose programmable controller. The problems encountered in prior art software approaches have been the inability of these programmable devices to keep up with the data rate streaming out of the delta modulator. Often accuracy and resolution suffer due to the inability of the processor to accept and process data within the delta modulators fundamental clock frequency. The present invention provides a highly accurate time based counting mechanism that overcomes the limitations of the prior art by exploiting the inherent synchronization of the adaptive counting window.

The fast clocks inherent to delta modulation pose their own special problems, Harvey explains:

The integrator op amp you select should have a gain-bandwidth product at least as great as the clock frequency. If the integrator doesn't have a high enough gain-bandwidth product, it won't effectively filter out analog switch's waveform and will therefore degrade the system's noise characteristics.

The present invention provides a method of reducing the gain-bandwidth product typically needed by prior art delta modulator techniques by the use of a plurality of digital delays in the feed back path of the delta modulator.

Other objects, features and advantages of the present invention will become apparent from a study of the detailed description and the accompanying drawings.

BRIEF DESCRIPTION OF THE PREFERRED EMBODIMENT

Figure 4:
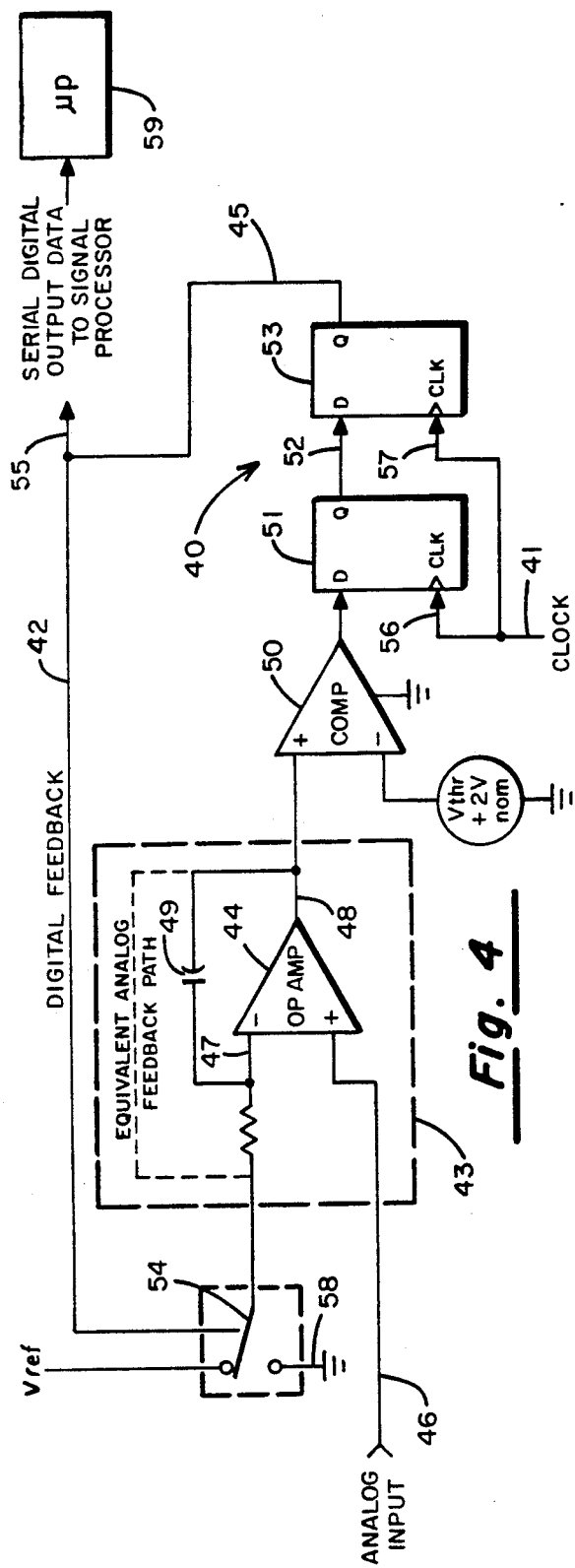
Figure 5A:
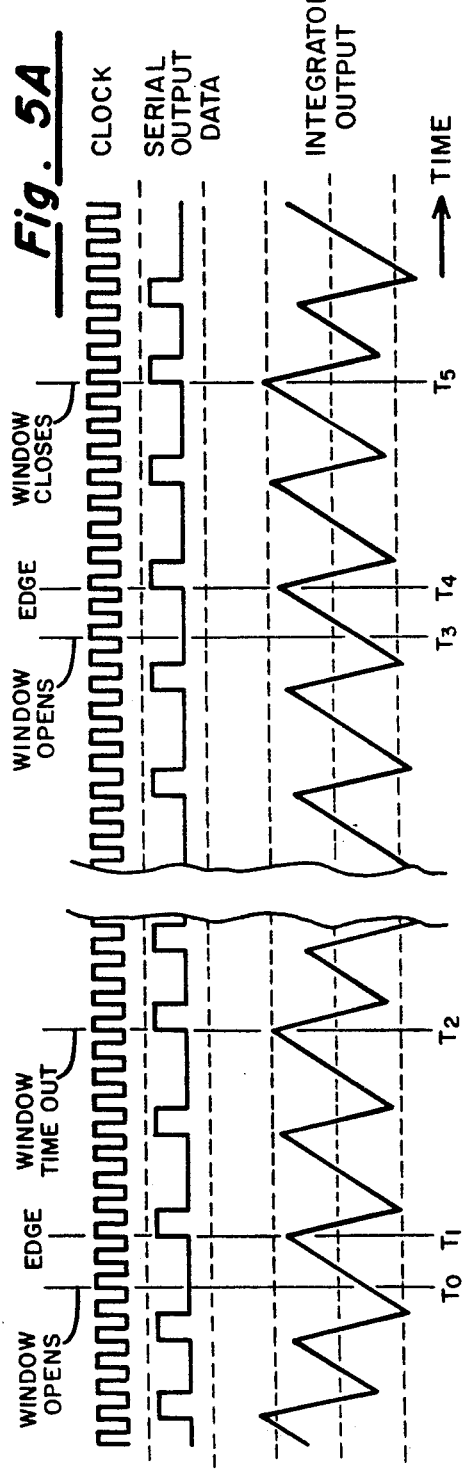
Figure 5B:
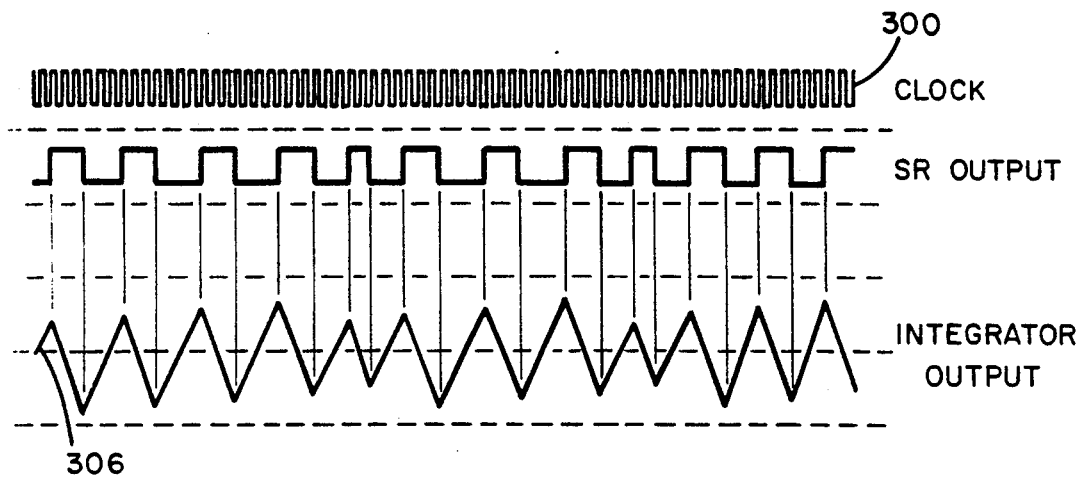
Figure 5C:
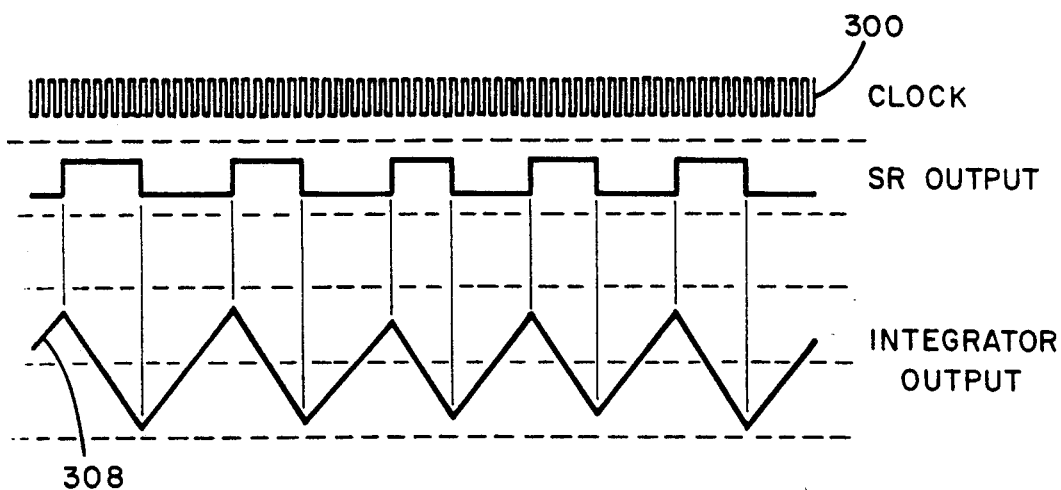
Figure 6:
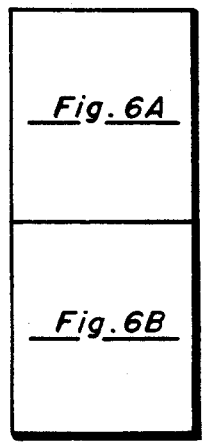
Figure 6A:
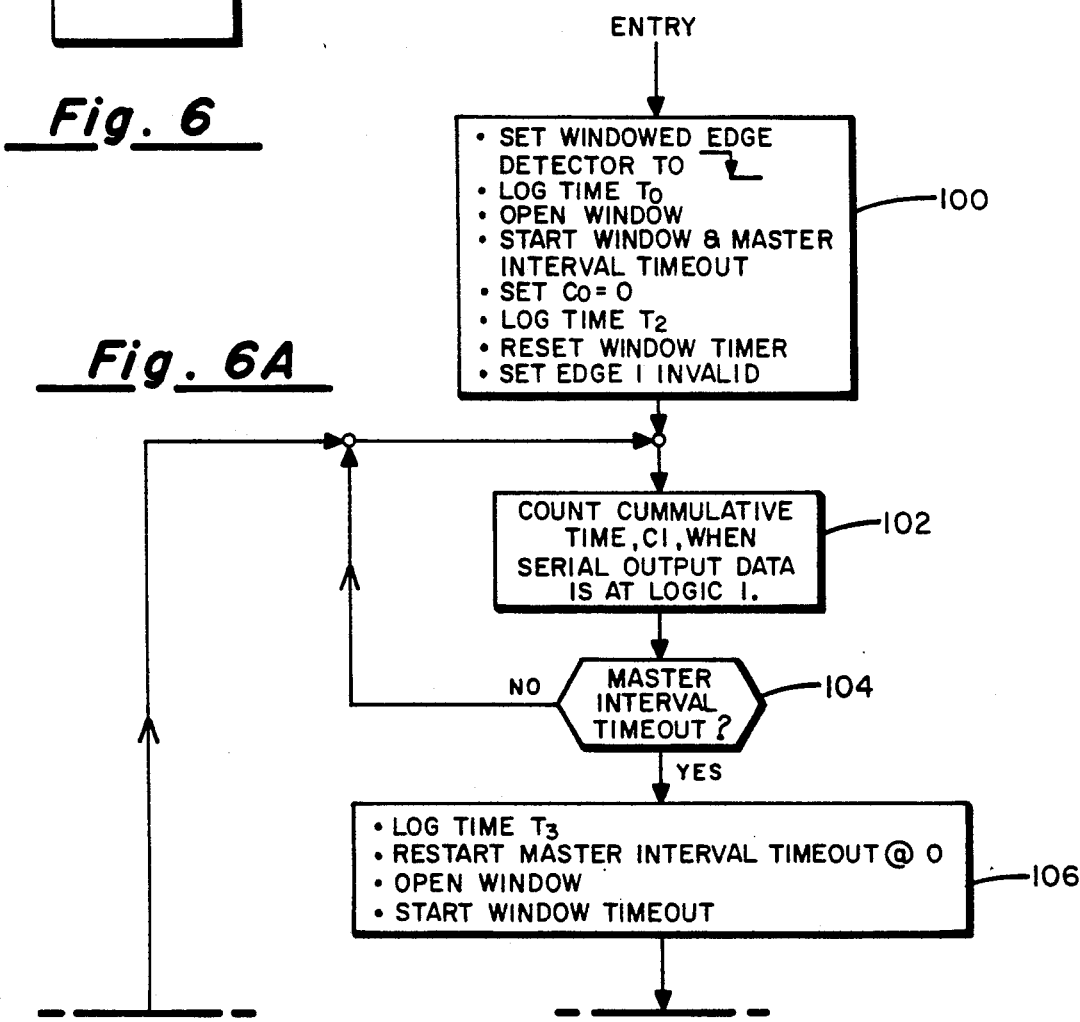
Figure 6B:
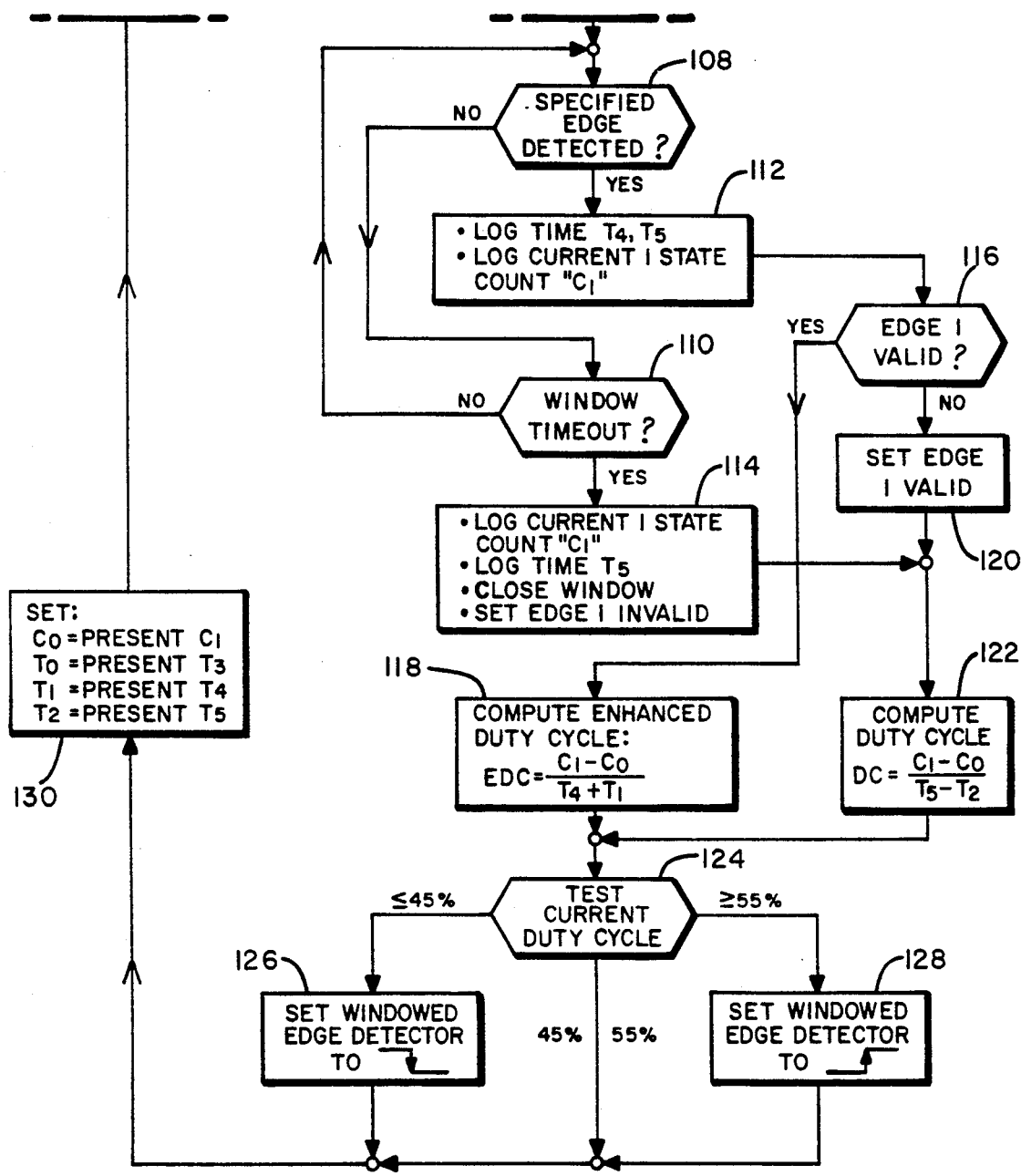
Figure 7:
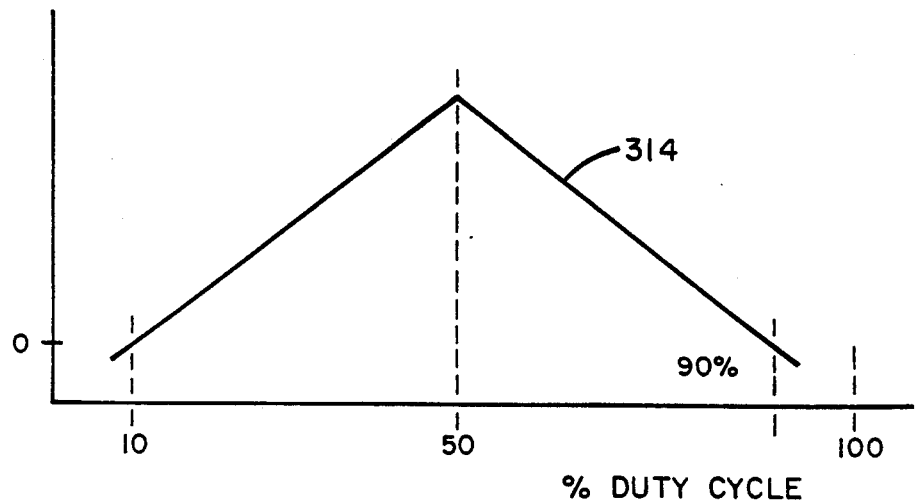
Figure 8:
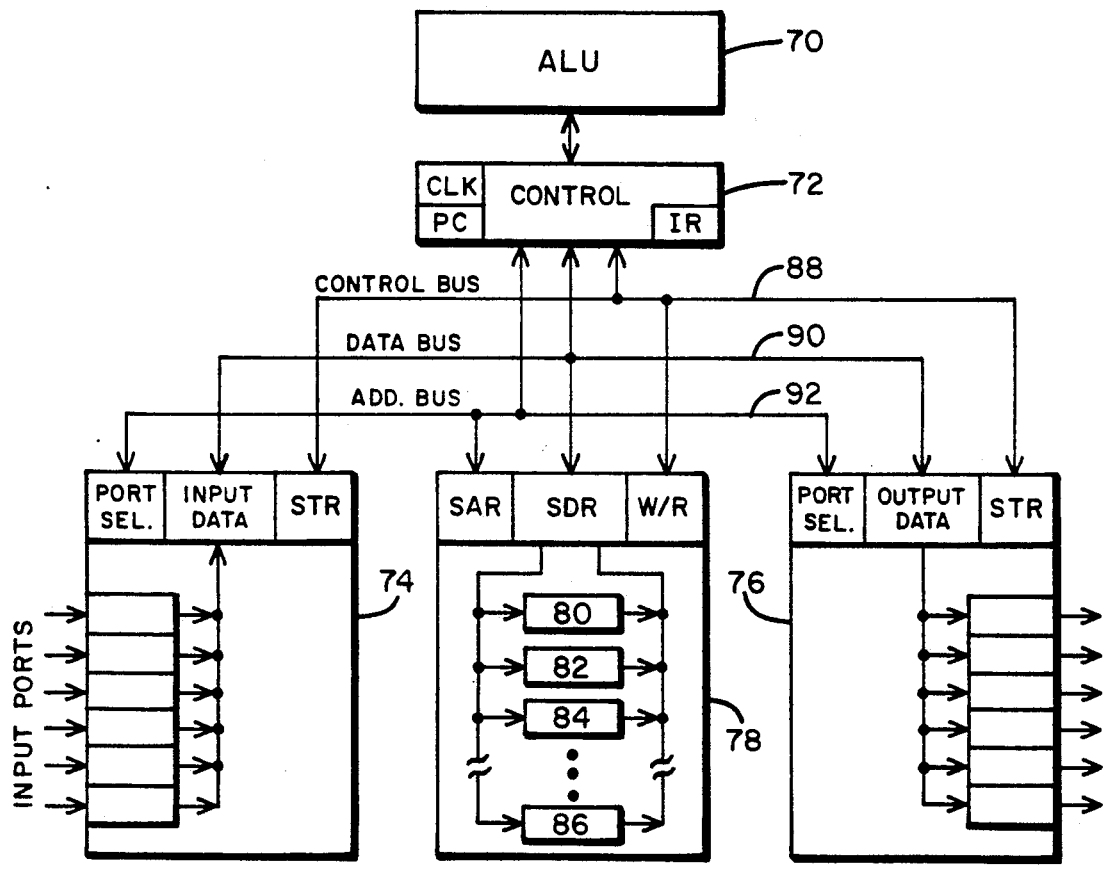

FIG. 4 schematically shows the hardware portion of the Δ-Σ quantizer in accordance with the preferred implementation of this invention;

FIG. 5A shows the essentials of the timing of the invention relating to the circuit shown in FIG. 4 and the data reduction process described in FIG. 6;

FIG. 5B illustrates the Δ-Σ quantizer waveforms for the circuit of FIG. 4 with two D-latches in series (dual stage shift register);

FIG. 5C illustrates the Δ-Σ waveforms for the circuit of FIG. 4 with four D-latches in series (quad stage shift register);

FIG. 6 is a flow chart for the sequence of data reduction operations;

FIG. 7 is a graph of the resolution improvement as a function of the operating point expressed as a duty cycle; and FIG. 8 is a block diagram of a typical microprocessor in which a program implementing the flow chart of FIG. 6 can be executed.

DETAILED DESCRIPTION OF THE PREFERRED EMBODIMENT

Figure 1:
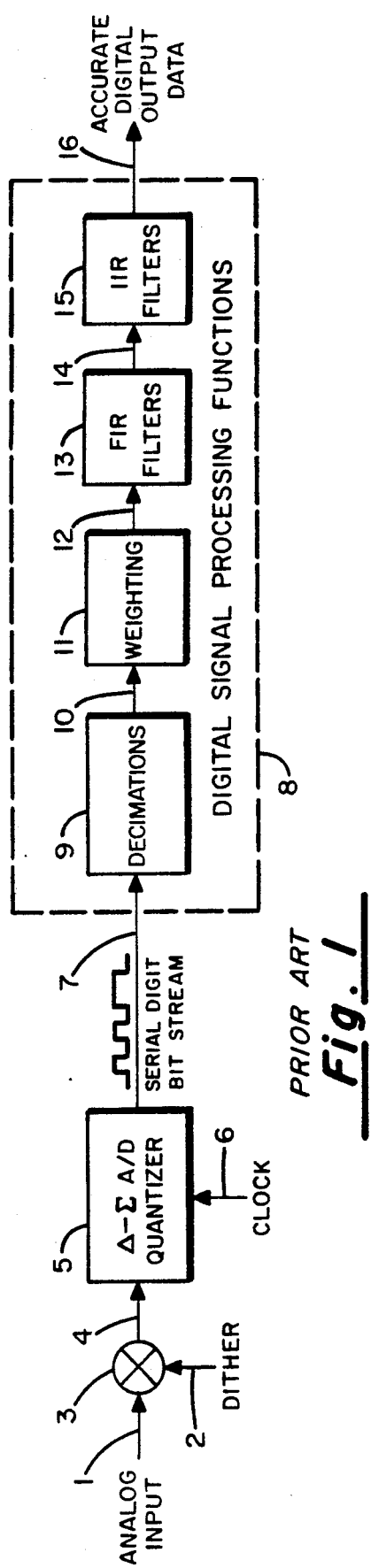
FIG. 1 shows a block diagram of a typical prior art $\Delta$-$\Sigma$ A/D conversion function implementation for use within an electronic system.

FIG. 1 is a block diagram of a generic prior art Δ-Σ A/D converter implementation at the system level. The analog signal output 1 consists of both AC and DC components. The Δ-Σ quantizer 5 may be of any order and may possess either a conventional linear or non-linear (as in high information delta modulation "HIDM" and adaptive delta modulation) transfer function, where the order is defined as the number of integrators embedded within the Δ-Σ A/D quantizer block 5. The output of the Δ-Σ A/D quantizer block is shown on line 7 and is a 1 bit serial digital data stream whose output is essentially "density" modulated and is proportional to the product of the input signal at 1 and the Δ-Σ A/D quantizer block's transfer function.

Figure 2:
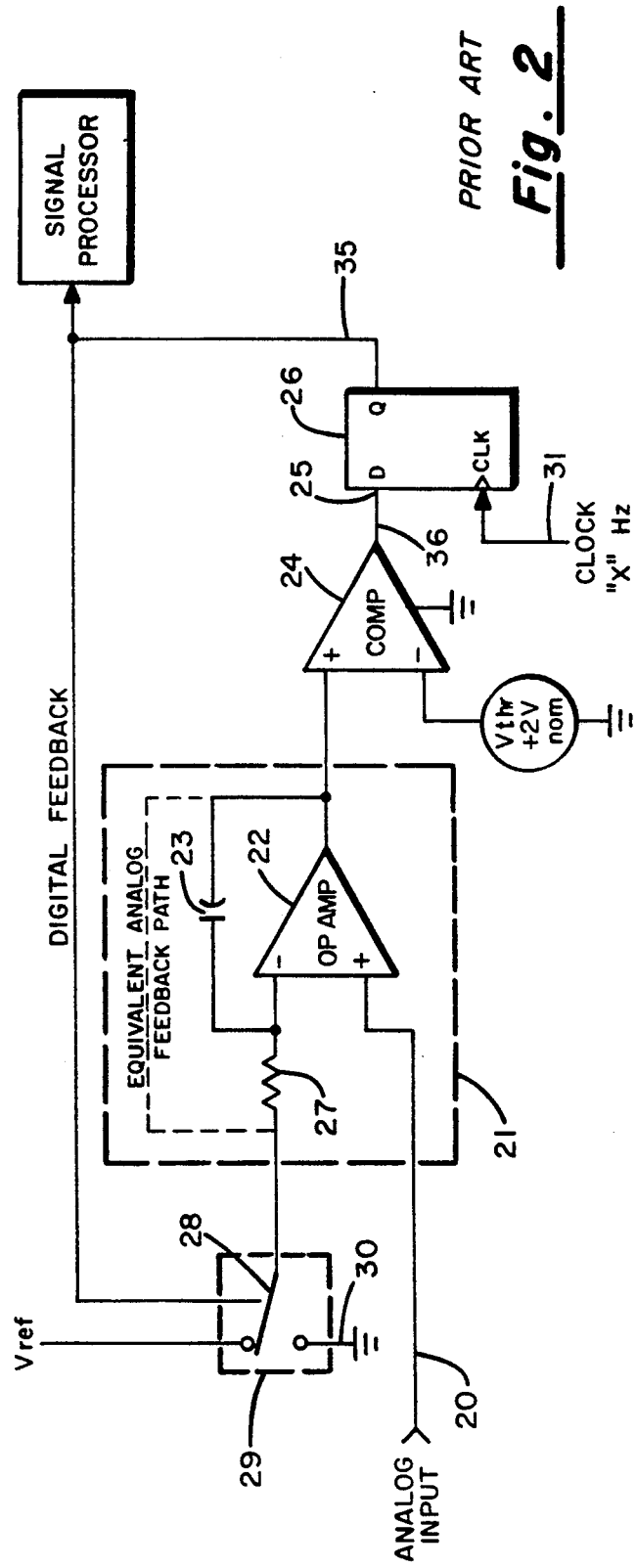
FIG. 2 shows a detailed schematic diagram of an elementary, prior art, first-order Δ-Σ quantizer.

For example, a simple prior art first-order linear Δ-Σ A/D quantizer is shown in FIG. 2 as being composed of an input signal source 20, an integrator shown enclosed by broken line box 21, composed of an operational amplifier 22 and a feedback capacitor 23, a comparator for threshold detection capability 24. The comparator may be either a real component as illustrated or a "pseudo" component where its function is implemented by the input switching threshold of the "D" input 25 to the D-type flip-flop latch 26 and functioning as a digital delay. A feedback resistance 27 and a means 28 for switching the feedback resistor 27 between the two reference potentials Vref'1' as at 29 and Vref'0's at 30 complete the quantizer.

Figure 3A:
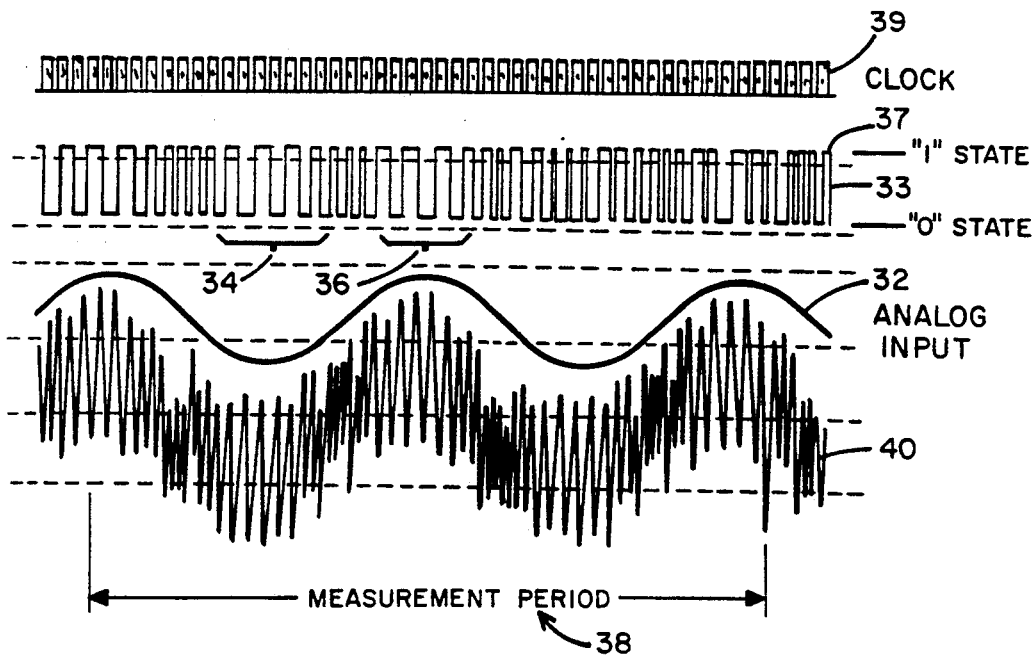
FIG. 3A shows typical waveforms within the prior art circuit of FIG. 2.

The prior art circuit of FIG. 2 will produce waveforms similar to those shown in FIG. 3A when a sinusoidal analog signal is applied to terminal 1 and a high frequency clock is applied to input line 31. Note that as the analog input signal 32 changes, the duty cycle of the "Q" output from D-flip-flop 26 shown at 33 in FIG. 3A (the Δ-Σ A/D quantizer's serial output on line 7) follows the input waveform. Note particularly how in FIG. 3 at the portion enclosed by bracket 34, the Δ-Σ A/D quantizer's serial output data on line 35 in FIG. 2 has a low short-term duty cycle over the interval, thus matching the input waveform 32 shown just below it while over the bracketed interval 36, the short-term duty cycle is higher, again matching the input signal. Such a circuit may be configured for operation either in an inverting mode or in the non-inverting mode as depicted in FIG. 2.

As set forth in the heretofore publication literature, the output data from prior art Δ-Σ A/D quantizer has been processed in several different ways. The attempt of all these known methods has been to reduce the raw Δ-Σ A/D quantizer's serial output data in a manner which can discern the finest incremental step size in the shortest period of time at point 16 in FIG. 1. In telecommunications parlance, this equates to maximizing the frequency response and dynamic range of the conversion process while maintaining a given minimum signal-to-noise ratio.

The prior art methods by which such output data has been manipulated to achieve these goals can be summarized as follows:

a. Averaging over time: This is the simplest method to reduce the output bit stream from a Δ-Σ A/D quantizer. The number of "1" states (see FIG. 3, number 37) of the Δ-Σ A/D output waveform 33 are "counted" during a fixed measurement interval, such as interval 38. The ratio of the total time spent in the "1" state to the fixed measurement interval equates to the average duty cycle measured over that interval. This method has the drawback that the resolution is limited to 1/d, where d is the number of clock cycles 39 contained within the fixed interval 38.

The resolution can obviously be improved by increasing the ratio of the measurement time to the clock period. This may be accomplished by increasing the measurement period 38 which results in a correspondingly longer net conversion time and, hence, worse latency. Another way to improve the resolution is to increase the frequency of the clock (waveform 39). The major limitation of that case is, that as the clock frequency is increased, a limit is reached where the gain/bandwidth product of the op amp 22 of FIG. 2 becomes insufficient and integrator 21 performance is degraded so that the desired level of accuracy cannot be maintained. Other secondary effects due to parasitic circuit elements also appear as the clock rate is increased.

b. Running Average: This averages many measurements as described in method "a" above. It adds many low resolution measurements together. This method takes many contiguous lower resolution measurements and concatenates them together to produce similar data to a measurement as described in method "a" having an equal overall period.

c. Running Averge combined with a small dither: Referring to FIG. 1, numeral 2 identifies this dither input to the basic data reduction scheme described in "a" above. It has been another method of improving the resolution, although this dither then needs to be filtered out. The purpose of dither is to force sub-LSB (i.e. <1/d) signals over the 1/d measurement threshold of the base hardware. This data would then be numerically averaged at block 9 in FIG. 1 to extract the germane information.

d. Running average combined with use of a digital filter: This is presently the most widely used prior art method of reducing the output data from the Δ-Σ quantizer 7. The key advantage of the running average followed by a digital filter implementation is that the digital filter reduces both the duty cycle ("density") and inter-bit phasing information contained in the Δ-Σ quantizer output 7 to achieve an output on line 16, of a given precision, faster (i.e., having less latency) than any of the previously mentioned prior art methods. This is commonly implemented as multiple stages of accumulation combined with decimation (block 9) and digital FIR filter 13 and/or IIR filters 15 within the signal processing block 8. This has the advantage of providing very high resolution; however, the latency (time delay) of the output data at 16 from the analog input stimulus at 1 can be excessive for control systems applications. The most obvious ways to overcome this long latency are 1) to shorten the filter functions, particularly the typically long latency FIR block 13, thus degrading resolution, and, hence, the signal-to-noise ratio; or 2) increase the frequency of the Δ-Σ quantizer which reaches hardware limitations, as described in method (a) above. The running average and digital filtering method is often combined with multiplying each input to the digital filter 13 by a time-varying weighting coefficient as represented by block 11. This bears a remote resemblance to the analog "dither" mentioned in method (b), however, dither is an additive process while weighting is a multiplicative process.

In accordance with this invention, the prior art Δ-Σ quantizer (the most rudimentary of which is shown in FIG. 2) is modified to include multiple shift register stages between the comparator 24 and serial digital data output line 35. More particularly, as shown in the preferred embodiment of FIG. 4, a two-stage shift register 40 is employed. The function of the multiple stages is to allow use of a higher clock frequency at line 41 in FIG. 4 while keeping the frequency of the digital feedback on line 42 at a sufficiently low value so that the performance of integrator 43 will not be adversely degraded by the finite gain-bandwidth product of the op-amp 44. The timing boundaries on which the output of the shift register chain at 45 may transition have a resolution of 1/X seconds where X is the clock frequency in Hz applied at 41. This is similar to the arrangement shown in FIG. 2, however, the digital feedback frequency is reduced in direct proportion to the number of shift register stages utilized in the implementation of FIG. 4. For example, the circuit of FIG. 2, the maximum digital feedback frequency is X/2 at line 35. In FIG. 4, the maximum digital feedback frequency at line 45 is X/2N, where N is the number of shift register stages. The digital feedback frequency for on line 45 in FIG. 4, hence, the gain/bandwidth product requirement for the op amp 44 are both reduced in inverse proportion to the number of shift register stages 40 in the forward path.

In accordance with another feature of the invention, the output data contained within the serial digital data output from the Δ-Σ quantizer is reduced to highly accurate result in a single decimation cycle without requiring subsequent digital filtering to attain such high precision. It should be understood, however, that digital filtering may be used for additional frequency shaping if desired for the end application. The means by which this improved decimation is accomplished is through the use of a non-fixed, slightly variable decimation cycle whose exact timing is data dependent. The timing uses a "windowing" process and is synchronized to state changes in the Δ-Σ A/D quantizers serial output data.

Referring to FIG. 5A, this adaptive decimation cycle is based on the history of the prior window. $T_0$ is the time that the system interrupt occurs forcing the opening of the window to check for and edge. $T_1$ is the occurrence of the edge if found during the $T_0$ to $T_2$ time period. $T_2$ is the predefined time out for the edge searching window. $T_3$ is the next occurrence of the system interrupt. $T_4$ is similar to $T_1$ in that it represent the capture of and edge. $T_5$ is similar to $T_2$ in that it represent the expiration of the edge capture window.

To properly analyze a sample period one has to look at a prior sample window as well as the current sample window. If the prior window captured an edge within the $T_0$ to $T_2$ time period then the window is defined to have begun at $T_1$. If the prior window failed to capture an edge within the $T_0$ to $T_2$ time period then the window is define to have begun at $T_2$. The total time that the signal spends at the one state is tracked with a counter in either case. If the prior window failed to capture an edge the window's leading edge is considered invalid. If no edge was captured during the $T_0$ through $T_2$ time period then the final edge is considered invalid. If previous edge is valid and the current edge is valid then the duty cycle is computed by determining the number of hi counts during the $T_1$ through $T_4$ time period and dividing by the $T_4$ through $T_1$ time period. If previous edge is valid and the current edge is invalid then the duty cycle is computed by determining the number of hi counts during the $T_1$ through $T_5$ time period and dividing by the $T_5$ through $T_1$ time period. If previous edge is invalid and the current edge is valid then the duty cycle is computed by determining the number of hi counts during the $T_2$ through $T_4$ time period and dividing by the $T_4$ through $T_2$ time period. If previous edge is invalid and the current edge is invalid then the duty cycle is computed by determining the number of hi counts during the $T_2$ through $T_5$ time period and dividing by the $T_5$ through $T_2$ time period.

By allowing the denominator in the duty cycle terms to vary an effective fine "vernier" counting method is realized in the measurement. This is most easily illustrated by the following example: Given an elementary prior art Δ-Σ quantizer, as shown in FIG. 2, assume a decimation cycle equal in time to 100 clock cycles. The step-wise resolution of the output, if processed using method "a" supra of the prior art, will be 1 part in 100 or 1%, i.e., slewing up from 9 to 11% duty cycle, the output steps will be 9 "1's" accumulated out of a possible full scale range of 100 or 9/100=9%, then 10/100=10%, and then 11/100=11%. Still using the same hardware configuration of FIG. 2 for consistency, and slewing over the same range, the data processing method embodied in this invention will follow the following numerical sequence; 9/100=9%, 9/99=9.09%, 9/98=9.18%, 9/97=9.28%, 9/96=9.38%, 9/95=9.47%, 9/94=9.57%, 9/93=9.68%, 9/92=9.78%, 9/91=9.89%, 9/90=10%=10/100, 10/99=10.10%, 10/98=10.20%, 10/97=10.31%, 10/96=10.42%, 10/95=10.53%, 10/94=10.64%, 10/93=10.75%, 10/92=10.87%, 10/91=10.99%=11/100=11%. Note how the denominator, which is equal to the measurement interval, is allowed to vary slightly, in this case from 90 to 100. From this sequence, it is evident that the discernable resolution has been improved by about an order of magnitude between the two methods at this particular operating point. The prior art implementation only resolved two steps between 9% and 11% duty cycle, while the method of the present invention is able to resolve 19 steps between the same two points. The actual resolution improvement are functions of the duty cycle operating point and the base value of the denominator term. The formula which describes the aboved enhanced accuracy is as determined by dividing 100 by the number of clock cycles in a window and multiplying this quantity by the quantity 0.5 minus the absolute value of the quantity 0.5 minus the ratio of the number of hi-counts divided by the number of clock cycles. These details are elaborated on further in the detailed description of the preferred embodiment.

OPERATION

Referring to FIG. 4, the analog signal at 46 is being constantly compared in op amp 44 to an input reference signal on conductor 47. The output of the op amp strives to maintain a comparison between the analog input signal and the reference. The op amp output on line 48 is thus either charging or discharging the integrating capacitor 49. The output 48 of the integrating stage shown enclosed by broken line box 43 is shown as being connected to the non-inverting input of a comparator 50 whose inverting input is fed by a predetermined reference voltage, thus providing a threshold which must be exceeded before the comparator 50 will switch states. In actuality, the comparator may be considered as a phantom component in that all D-type latches, as at 51, have a built-in threshold. Latch 51 may be considered as a clocked delay. This clocked delay serves to candies the sample balancing signal on line 48 from the integration stage 44 The output 52 of the clocked delay 51 is fed into an additional clocked delay device 53 comprising a D-type latch. Series connected latches 51 and 53 comprise a clocked two-stage shift register 40. It should be understood that additional stages may be included to create an N-stage shift register. The feedback from the latch 53 on line 42 is added to the feedback of the integrating capacitor 40. The dual stage shift register 40 thus serves to reduce the gain bandwidth requirement of the operational amplifier 44 because a delay in the change of the output signal of the operational amplifier fed back to its signal input, via line 42 and phantom switch 54 is introduced by the N-stage shift register. The intervening latch or latches then act as a buffer against sharp changes in state of the signals on the feedback path 42. By buffering the state changes over time of the feedback, the operational amplifier 44 is required to slew at a lower rate, the slew rate being equal to 1 over the number of delay latches in the feedback path.

In accordance with this invention, the above-described prior art Δ-Σ A/D quantizer of FIG. 2 is modified to include multiple clocked shift register stages between the integrator and the serial digital data output point. The function of the multiple stages is to allow use of a high clock frequency for clocking the shift register while keeping the frequency of the digital signals fed back to the phantom switch 54 at a sufficiently low value so that the integrator performance will not be adversely degraded by the finite gain/bandwidth product of the op amp 44 of the integrator 43. The timing boundaries on which the output of the shift register chain may transition have a resolution of 1/X seconds where X is the clock frequency of Hz. This is similar to that in the prior art arrangement. However, the digital feedback frequency is reduced in direct proportion to the number of shift register stages utilized. For example, with only a single D-type flip-flop coupled between the integrator and the serial digital data output line 35, the maximum digital feedback frequency is X/2. In accordance with this invention, the maximum digital feedback frequency to the electronic switch is X/2N where N is the number of shift register stages. The digital feedback frequency of the present invention and, hence, the gain/bandwidth product requirement for the integrating op amp are both reduced in inverse proportion to the number of shift register stages in the forward pat.

The digital output 55 comprises a digital serial waveform which represents the analog signal over time. As the analog signal varies between its operational limits, the output of the operational amplifier will be logical "0" or a logical "1" corresponding to the analog voltage. The analog signal will be sampled with a resolution depending upon the clock cycle of the system. The entire system is clocked with a sampling clock at terminals 56 and 57.

The operation of the circuit in FIG. 4 can be better understood by referring to FIGS. 5A-5C which are plots of signal waveforms over time at various points in the circuit and with different numbers of shift register stages. These signals were obtained during the operation of a system constructed in accordance with the present invention. Plotted on the graph of FIG. 5A are four signal waveforms. The first signal 60 is a representation of the system clock, which in FIG. 4, is applied to terminal 41. The system clock, in this case, is shown as having a 50% duty cycle clock. The next waveform 61 on the graph of FIG. 5A is the output of the latch 53 on line 45. The output of the latch switches between the 0 and 1 state in response to the output of the integrator 43. The plot of integrator output is indicated by waveform 62 which shows it slewing in a triangular waveform in response to the input to the integrator on line 46, the feedback of the capacitor 49 and the operation of the latches 51 and 53. Waveform 63 is a plot of an analog input signal (a sine wave) applied to input line 46 when the input to terminal 47 switched between ground 58 and $V_{ref}$. The signal processor 59 reads this signal 61 and determines the digital form of the analog signal.

FIG. 5A shows that during the high output of the latch 53, the integrator is discharging until such time that the latch 53 changes state to a 0 and the integrator starts charging. It can also be seen from the diagram of the latch output versus the sample signal that as the sample signal increases, the duration of time that the latch is at a 0 state increases. When the signal is at a maximum value, the output of the latch is maintained at a 0 state for the longest period. During the middle of the swing of the sinusoidal input signal, the output of the latch is in the 0 state and the 1 state an equal amount of time. It can be seen then that for any sample period, the signal processor must be able to count the number of highs and lows and calculate the duty cycle during a sample window.

Figure 3B:
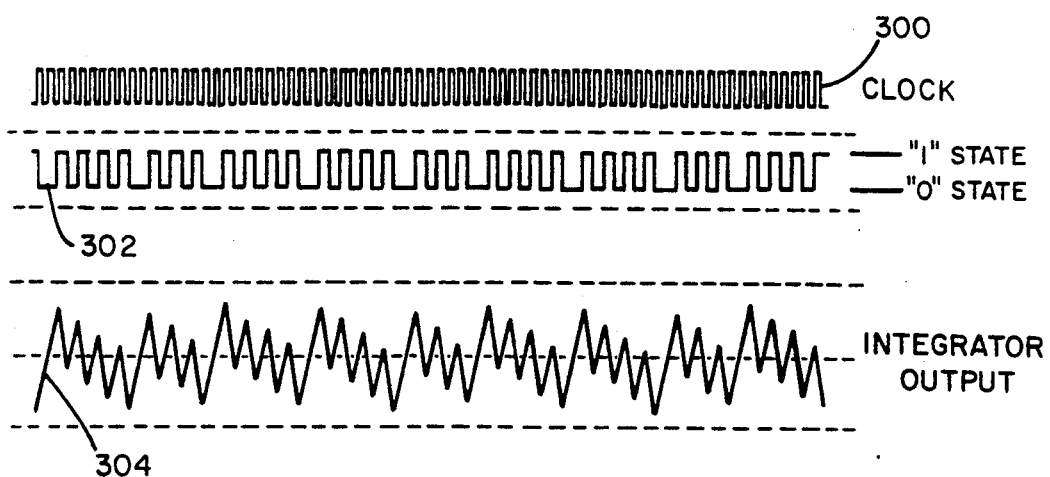
FIG. 3B illustrates the waveforms for the Δ-Σ quantizer shown in FIG. 2 having a single D-latch.

To illustrate the advantages of the method of the invention modulator performance for a single, double and quadruple latch configuration is shown in FIGS. 3B, 5B and 5C, respectively. All three Δ-Σ A/D converters whose waveforms are shown in these figures have a common system clock frequency (waveform 300). FIG. 3B shows the case of the single clocked digital delay feed back to the integration phase. The output of the flip-flop is shown on line 302 and the output of the integration stage is shown on line 304. The slewing behavior of waveform 304 can be considered the base line for the prior art. FIG. 5B is a graph resulting from an operation of one embodiment of the invention utilizing a dual flip-flop shift register. The graph of the integrating stage output 306 aptly illustrates the decrease in slew rate afforded by the addition of one clocked delay. FIG. 5C further illustrates the reduction in slew rate when four flip-flops are chained in forming the shift register. The introduction of three additional delays affords a drastic reduction in slew rate as illustrated by waveform 308.

Referring next to FIG. 8, there is shown a general block diagram of a microprocessor based controller which is configured to implement the signal processor 59 of FIG. 4. It is quite conventional in its architecture, including an arithmetic/logic unit 70, a control 72, an input module 74 which includes a plurality of input ports, an output module 76 which includes a plurality of output ports and a memory 78 including a plurality of storage registers as at 80, 82, 84 . . . 86. Control signals are applied to the modules 74, 76 and 78 via a control bus 88 coupled to the control module 72. Data signals are carried by a data bus 90 while address signals for selecting particular memory addresses and input/output ports are carried by the address bus 92.

It is another feature of this invention that a means is provided by which the output data contained within the serial digital data output from the $\Delta$-$\Sigma$ quantizer may be reduced to a highly accurate result in a single decimation cycle without requiring subsequent digital filtering to attain such high precision. Digital filtering may, however, be used for additional frequency shaping if desired for the end application. The means by which this is accomplished is through the use of a non-fixed, slightly variable decimation cycle whose exact timing is data dependent. The timing uses a "windowing" process and is synchronized to state changes in the $\Delta$-$\Sigma$ quantizers serial output data.

In implementing the present invention, the internal registers of the microcontroller include a timing register for producing periodic interrupts or markers at fixed time intervals, a duty cycle register, an end-time register, a start-time register, a current-edge register, a previous-edge register, a previous-signal register and a current signal register, whereby the algorithm illustrated by the flow diagram of FIG. 6 can be executed. These registers are implemented in the memory module 78 and, as such, are fully addressable for both reading and writing. Also stored in the memory module 78 is the program for executing the sequence of steps illustrated in the software flow diagram of FIG. 6. Referring now to FIG. 6, the method whereby the accuracy of the delta-sigma modulator is enhanced will now be described.

The digital signal output from latch 53 on line 45 is in direct proportion, frequency-wise, to the analog signal applied at 46 at any given time. The process flow diagram starts at process flow block 100. At this point the window edge detector is set to an initial negative edge indicated by a downward arrow, the system interrupt timer to 0, the first timing window is opened, the window and system interrupt timer are started, the hi-count counter is set to 0, and the previous-edge flag is set to invalid. The times $T_0$, $T_1$, $T_2$, $T_3$, $T_4$ and $T_5$ are as described in reference to FIG. 5A. The register hi-count is the number of hi digital pulses that have occurred in a window. The duty-cycle register relates the amount of time the signal was high to the total time. This variable is assigned initially to a value of 0. The assignment of the initial edge detection value as negative is arbitrary. The positive edge may be selected just as well. The process then flows to process block 102 which begins to count the number of hi-counts when the input signal is hi. Counting proceeds at the rate of the system counter's clock. The system counter's clock determines the lower bound of resolution for the system. Thus, a faster clock will result in a higher resolution result. When the clock is started, time is defined as 0. During this time the signal processor accepts a input signal from the latch 53. The latch is constantly providing signals which represent a buffered version of the output of the integrator 43. If the output of the integrator is greater than the threshold value of the latch, the output of the latch after a clock is seen at 41 will be a logical "1" or high. If the input of the latch or the output of the integrator is below the logic level threshold for the input of the latch then the output of the latch on a line 45 will be logical "0" or low.

Decision block 104 is a time-out check. The method of the invention utilizes a timing window whose length is defined at the start of the operational sequence. In a typical embodiment of the invention, the timing window may be 5 ms which would correspond logically to a multiple of the system's clock cycle. In the case of a time-out, the time is a modulus of the window period. The system is not waiting this amount of time, but rather receives an interrupt marker at each multiple of the window. With a 5 ms clock an interrupt is received at time 0, 5, 10, 15 ms, etc. In the case of decision block 104, there is a "no time-out" condition when the interval of the window has not yet expired. In this case, the process flows back block 102 where another signal is sampled and hi-count is incremented if it is a logical 1. Thus, the blocks 102 and 104 represent a loop that is repeated each clock cycle during a window period. If a time-out exists at decision block 104, a window has expired and all that is left to do wait for another the next edge and to precisely count the number of hi-counts that have occurred at the output of the latch 53. The count output of the latch 53 is directly proportional to the input analog signal during the period of the sample.

After a time-out has occurred, the process flows to block 106 which logs $T_3$, restarts the system interrupt timer, and starts the edge capture window timer.

The process then flows to check the signal for a specified edge. If the signal edge is equal to the window edge then a valid edge has been found within the $T_0$ to $T_2$ time frame and the process flows to block 112. If a valid edge was not found then the process flows to decision block 110 where a time-out check is performed. In this case, the time-out check is a valid interval timer which indicates how long since the time-out window has elapsed the check for input signals has been in progress. If the time-out has occurred, then flow is to process block 114. If there has not been a time-out yet, in other words the amount of time that is allocated for looking for another signal has not expired, the process flows back to block 108 to check another signal. In one embodiment of the invention, the system waits 80 microseconds for an edge the duration of time between $T_0$ and $T_2$ or $T_3$ and $T_5$. The loop between process block 108 and decision block 110 constitutes a sampling of the input signal for a valid edge. If the specified edge has been detected within the $T_0$ to $T_2$ time frame then the process flows to block112.

At block 112 times $T_4$ and $T_5$ and the hi-count is logged. The process then flows to block 116 where a determination is made of whether or not the previous edge was valid. If the previous edge was valid then the process flows to 118 to compute the enhanced duty cycle. The enhanced duty cycle is defined as the hi-count divided by the $T_4-T_1$ interval. If the previous edge was not valid then the process flows to block 120. At this time the previous edge is defined as valid. The process then flows to 122 from both the 120 block and the 114 block to determine the duty cycle as the hi-count divided by the $T_5-T_2$ interval.

The process then flows to decision block 124 which decides, based on the duty cycle of the previous period, whether to check for a negative edge, a positive edge, or use the last edge that is currently in use. The case of a 45% or less duty cycle indicates in process flow block 126 that the edge to be checked is the negative edge. The negative edge is determined to be the change in the output of the latch that results in the output going from high to low. If the old duty cycle is greater than 55%, the process then flows to process block 128, which indicates a check for the positive edge. The positive edge is defined as the output of the latch changing from a low state to a high state. If the duty cycle is between 45% and 55%, then we use the edge that we used in the last sample window. The window's duty cycle has been determined.

The process then flows to block 130 which transfers the values of $T_5$ to $T_3$, $T_4$ to $T_1$, $T_3$ to $T_0$ and resets the hi-count. The process then flows to block 102 to begin counting in the next window.

The method of the invention provides a way of very accurately determining the digitized output value of the analog signal. By definition the increase in accuracy over the prior art can be measured by noting the smallest measurable change in output value that can be accurately checked from the system. For example, during a sample window period, the number of counts out of the latch may 250 counts. The corresponding total time interval to generate these 250 counts could be equal to 2,499 counts. This can be compared to the next smallest measurable step which would be a count of 250 from the output of the latch divided by the associated time interval 2500. The first measurable sample yields a fraction of 250/2,499 the second measurable sample yields a fraction of 250/2500. Subtracting these two numbers from each other results in a difference of 1/24,990, a very small difference. Stated another way, there are 24,990 different values that the system could attain, which yields a total resolution of 24,990 samples in a window period. This number is to be compared favorably to the prior art where the resolution available during the a simple counting period is only 2500.

The actual resolution improvement and differential non-linearity are functions of the duty cycle operating point and the base value of the denominator term (base period) and allowed deviation (windowing period). FIG. 7 shows the relationship between duty cycle and improvement over the range of duty cycle values from 10% to 90%. The improvement graph 314 shows that as the duty cycle approaches 50% the improvement bottoms out. As the duty cycle approaches either extreme the improvement reaches its highest values.

The method of the invention outlined in FIG. 6 can be implemented in a number of ways. However, it is preferred that the method of the invention be implemented through the use of a commercial programmable controller such as an INTEL 87C 51 FB that has a number of system counters and timers based upon a crystal controlled clock and the ability to manipulate data between internal registers and counters.

Tables 1-5 below set forth the adaptive window method which, when executed in the programmable controller 59, will enhance the accuracy with which the delta-sigma modulator converts the digital bit stream into a quantized representation thereof. It is to be understood, however, that those skilled in the art will be able to implement the method with different coding and that of Tables 1-5 is illustrative and not limitive of the invention.

To implement the adaptive counting window technique with a programmable device requires the availability of a number of timing and counting registers, intermediate result registers and final results registers all under control of the programmable device. Table 1 lists the registers and their function in the method of the invention

TABLE 1

List of Register Variables, Timers and Counters and their Description

Cumulative Time Count - Register
The total time that the system has been running is stored in the Cumulative Time Count register. This register is set up at the start of the system to zero. This count is incremented by a system timer each system clock cycle.
Interrupt Timer - Timer
Times the basic duration of the adaptive window. At the conclusion of the interval being waited, the Wait for Window Edge routine is called to capture the next active edge.
Wait Time - Register
Indicates how long the Wait for Window Edge routine has been waiting for a valid edge. If the Wait Time exceeds the Wait Period ( 80 microseconds for example ) then the Wait for Window Edge routine times out.
Cumulative Signal Count - Register
The total number of valid system clock cycles that have occurred since the system has been running is stored in the Cumulative Signal Count register. This register is adjusted for processing delays.
Edge Time - Register
The Edge Time register stores the time at which the adaptive window period closes.
Edge Capture Flag - Flag
The Edge Capture Flag indicates whether or not a valid edge was captured during the adaptive window.
Read on Positive Edge Flag - Flag
The Read on Positive Edge Flag indicates whether or not to start counting system clock cycles on a positive or negative going edge in the signal bit stream.
Signal Time Pulse - Register
The value in the Signal Time Pulse register is equivalent to the duty cycle or the proportion of the signal time that meet the edge condition divided by the total window period.
Data Capture Invalid Flag - Flag
The Data Capture Invalid Flag signals the Wait for Window Edge routine that the Capture Edge routine has completed.
Previous Time Count - Register
The Previous Time Count register stores the beginning of the adaptive window. This register is initialized to zero.
Raw Time Interval - Register
The Raw Time Interval register represents the total time elapsed during the adaptive window.
Raw Signal Count - Register
The Raw Signal Count register represents the total number of valid clock cycles that have occured during the adaptive window.

Table 2 lists the Initialize Adaptive Window Method routine. the Initialize Adaptive Window Method routine configures the system timer and starts the interrupt timer. This embodiment of the invention will use the interrupt generated by the timer to call the Wait for Window Edge routine. In one embodiment of the invention the interrupt timer is set to 5 milliseconds and the Cumulative Time Counter is set to the system clock of 1 MHz.

TABLE 2

Name: Initialize Adaptive Window Method
Function: Initialize counters, timers and clocks
Returns: Sets up interrupt and waits.
1  Configure Cumulative Time Counter to count at a system clock cycle (i.e. 1 MHz)
2  Start Counter 0
3  Configure Interrupt timer to window interval (i.e. 200 Hz timer)
4  Start Interrupt timer
5  Wait for Interrupt timer to CALL Wait for Window Edge Routine Table 3 lists the Wait for Window Edge routine. This routine represents the basic routine called when the interrupt timer generates a window interrupt. The first task done is the determination of the valid edge. Processor clock cycles required to implement the stages of the routine are accounted for precisely. At appropriate intervals counter values are adjusted to reflect inherent delays imposed by the processing apparatus. The routine then calls the Capture Edge routine to wait for valid edge. When a valid edge occurs the elapsed time during the window is computed as well as the net value of valid clock cycles seen during the window period.

TABLE 3

Name: Wait for Window Edge
Function: Called by interrupt timer to wait for next active edge and calculates duty cycle.
Return: Sets duty cycle which represents the digital representation of the sampled signal.
26  IF the Read on Positive Edge Flag is set
27  THEN
28    IF the Signal Time Pulse is less than 45 percent
29    THEN
30      Clear the Read on Positive Edge Flag
31    ENDIF
32  ELSE
33    IF the Signal Time Pulse is greater than 55 percent
34    THEN
35      Set the Read on Positive Edge Flag
36    ENDIF
37  ENDIF
39  Clear the Data Capture Invalid Flag
40  IF the Read on Positive Edge Flag is set
41  THEN
42    Set the Cumulative Signal Count capture a positive edge
43  ELSE
44    Set the Cumulative Signal Count to capture a negative edge
45  ENDIF
46  CALL Capture Raw Data on Edge Transition
47  UNTIL the Data Capture Invalid Flag is clear
48  IF the Read on Positive Edge Flag is set
49  THEN
50    IF Edge Capture Flag is set to indicate no edge
52    THEN
53      Adjust for register transfer delay (subtract four from h Cumulative Signal Count)
55    ENDIF
56  ENDIF
57  Subtract Previous Time Count from Edge Time
58  SET the Raw Time Interval to the difference
59  SET the Previous Time Count to the Cumulative Time Count
60  Subtract the Previous Signal Count from the Cumulative Signal Count
61  SET the Raw Signal Count to the difference
63  SET the Previous Signal Count to the Cumulative Signal Count
64  Divide the Raw Signal Count by the Raw Time Interval Table 4 lists the Capture Edge routine. This routine precisely determines the occurrence of a valid edge. First a short interval timer is configured to wait a pre determined amount of time for the valid edge. In one embodiment of the invention this time is set as 80 microseconds. If the valid edge does not occur during this time period then the routine is considered to have timed out and a timed out signal is returned to the caller. If a valid edge does occur during the interval and a previous time period has a valid edge then the time that it has occurred as well as the total valid counts are determined very precisely. Counts are adjusted for processing delays including register transfer delays and stack subroutine calls. The routine tells the caller whether or not a valid edge was found during the allotted window.

Improved counting accuracy can be obtained if the clock speed of the timer is greater than the timer measurement. If the clock speed of the incoming signal is less than the clock speed of the timing mechanism then a very precise aliasing technique is used to determine the time that the valid edge has occurred. The improved counting accuracy is maintained as well. Since incoming signal edges must fall on the fundamental clock cycle of the incoming signal, all true time measurements must also tall on the fundamental clock cycle of the incoming signal. This means that if a time measurement is not syncronous to the clock cycle of the incoming signal, all that needs to be done to correct the measurement is to readjust the time measurement to the lowest clock cycle of the incoming signal. In one embodiment of the invention the processor clock speed is 1 MHz and the fundament clock cycle of the incoming signal is 500 KHz. This situation insures that all true measurements of signal edges will occur on 500 KHz boundaries. Thus any measurements not on a 500 KHz boundary need to be adjusted downward to the nearest 500 KHz boundary.

TABLE 4

Name: Capture Edge
Function: Capture edge transition after window has expired
Return: Sets count to the total signal pulses received
Sets end_time to the time of last pulse edge
6  DO WHILE Wait Time is less than or equal to Wait Period (i.e. 80 microseconds) and no edge has occurred
7    Check for an occurrence of an edge
8  ENDDO
9  IF Wait Time is less than or equal to Wait Period
10 THEN
11   stop counting Cumulative Signal Count
12   adjust Cumulative Signal Count for register transfer delay
13   SET Edge Time to Cumulative Time Count
     adjust Edge Time for register transfer delay
     SET Edge Capture Flag to indicate an edge was captured
14   IF signal rate is less than sample rate
15   THEN
16     decrement count to the lowest even divisor of the signal_rate
17   ENDIF
18 ELSE
19   IF the Wait Time is greater than the Wait Period
20   THEN
21     stop counting Cumulative Signal Count
22     adjust Cumulative Signal Count for register transfer delay
23     set Edge Time to Cumulative Time Count
       adjust Edge Time for register transfer delay
       SET Edge Capture Flag to indicate an edge was NOT captured
24   ENDIF
25 ENDIF Comparing the method and apparatus of the present invention with the prior art, in the past, the traditional way of measuring the output from a delta-sigma modulator A/D converter has been to measure an average duty cycle by counting the number of pulses from the flip-flop or latch 26 in FIG. 2 occurring within a fixed interval and then dividing it by the length of that fixed interval. In an attempt to improve the resolution which, of course, is pegged to the clock frequency is to introduce analog dithering. In accordance with the present invention, however, the interval involved is not fixed but instead, at the conclusion of a fixed interval, a window is opened in which an examination is made for a predetermined type of transition, either positive or negative, at which point the window closes. The period during which the duty cycle and time interval are computed is then the fixed time interval plus the amount of time in the window leading to the first transition. Using this approach, high resolution output data is acquired. This high resolution performance is achieved without requiring additional hardware such as a dedicated digital signal processor or other known approaches including analog dithering. Furthermore, by using more than one delay device, the common clock frequency is effectively multiplied by the total number of such delayed devices employed. Hence, if the basic clock frequency is, say, 50 KHz with one clocked delay device and the circuit is changed to employ two, the clock frequency for each of the delay devices would be 100 KHz. The accuracy improvement using this approach is equal to the number of such clocked delay devices employed in that the number of clock cycles in the fixed interval of time is also increased. A further advantaged achieved by concatenating the delay devices is that it allows the op amp integrator to operate at the basic clock frequency which is lower than the clock frequency for the delay devices.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A delta-sigma modulator for an analog-to-digital converter comprising, in combination:
   (a) a source of time varying analog signals;
   (b) a first-order signal integrating means having an input terminal and an output terminal, said source of analog signals being coupled to said input terminal and producing at said output terminal a changing output signal proportional to the integral of said analog signals;
   (c) a plurality of clocked digital delay means, each with a clock input terminal, a signal input terminal and an output terminal, the signal input terminal of a first of said plurality of delay means being connected to said output terminal of said first-order signal integrating means and said signal input terminal of a second of said plurality of delay means being connected only to said output terminal of said first of said plurality of delay means;
   (d) a single feedback path coupling said output terminal of said second of said plurality of delay means to said input terminal of said first-order signal integrating means; and
   (e) means for applying regularly occurring clock pulses simultaneously to said clock input terminals of said first and second of said plurality of delay means whereby a predetermined delay is introduced to said changing output signal at said output terminal of said signal integrating means before being fed back to said input terminal of said signal integrating means to thereby decrease the gain bandwidth product requirements of said signal integrating means without sacrificing the resolution of said analog-to-digital conversion.

2. The delta-sigma modulator as specified in claim 1 wherein each said plurality of clocked digital delay means comprises a D-type flip-flop having a Q and a $\bar{Q}$ output, wherein said signal input terminal of said signal of said plurality of delay means is connected to said Q output of said first of said plurality of delay means, and wherein said Q output of said second of said plurality of delay means comprises said output terminal of said second of said plurality of delay means.

3. In a delta-sigma modulator of the type including integrator means having an input terminal and an output terminal with said input terminal being coupled to receive a time varying analog input signal, and said output terminal coupled through clocked digital delay means having a first clock frequency to a data input terminal of a signal processor, said signal processor having timing means including a second clock frequency, a timing register for producing periodic interrupts, counting means and a plurality of digital data storage registers for storing as contents, digital values, said plurality of registers, including a hi-count register, a duty-cycle register, an end-time register, a start-time register, a current-edge register, a previous-edge register, a previous-signal register, a current-signal register, and a count-ones flag bit, a method for counting the number of pulse transitions occurring during a predetermined window period followed by a subsequent pulse transition, comprising the steps of:
   (a) resetting each of said plurality of storage registers to a predetermined initial digital value and setting said previous-edge register to a negative edge state;
   (b) starting said timing means;
   (c) testing the contents of said duty-cycle register and, based upon the digital value thereof, setting said current-edge register to a negative edge state when said digital value in said duty cycle register is less than a predetermined lower bound, setting said current-edge register to a positive edge state when said digital value in said duty cycle register is greater than a predetermined upper bound and setting said current-edge register to the value of the previous-edge sate when the digital value in said duty cycle register is greater than or equal to the said predetermined lower bound and less than or equal to the said predetermined upper bound;
   (d) setting the digital value in said start-time register to be equal to the current value contained in said timing register;
   (e) inputing into said current-signal register a digital value present at said data input terminal of said signal processor;
   (f) testing the contents of said current-signal register and based upon the contents thereof, setting the count-ones flag bit active when a positive edge state has occurred and setting the count-ones flag bit inactive when a negative edge state has occurred;
   (g) incrementing the contents of the hi-count register by one when the count-ones flag bit is active;
   (h) testing for one of said periodic interrupts from said timing register and if no interrupt is present, repeating steps e, f, g and h;

(i) inputing into said current-signal register the digital value present at said data input terminal;

(j) testing the contents of said current-signal register and, based upon the contents thereof, testing whether a predetermined time has elapsed since a preceding one of said periodic interrupts occurred and if said predetermined time has not elapsed, repeating step (i) when the digital value stored in said previous-signal register is equal to the digital value of the current-signal register; and (k) setting the end-time register to the digital value contained in said timing register and setting said duty-cycle register to a computed digital value equal to the ratio of the contents of said hi-count register divided by the difference between the end-time register value and said start-time register value and setting the contents of the previous-edge register to the digital value then stored in said current edge register and repeating steps c through k.

4. The method as in claim 3 wherein step k further includes:

(a). adjusting the values contained in said hi-count register, said end-time register, and said start-time register to take into account processing delays.

5. The method as in claim 3 wherein step k further includes:

(a) adjusting the value of said hi-count register when said first clock frequency is greater than said second clock frequency and the value of said hi-count register is not an even multiple of the ratio of the said first clock frequency to said second clock frequency to the next lowest even multiple of said ratio.

* * * * *

UNITED STATES PATENT AND TRADEMARK OFFICE
CERTIFICATE OF CORRECTION

PATENT NO. : 5,245,343
DATED : September 14, 1993
INVENTOR(S) : Michael W. Greenwood, et al.

It is certified that error appears in the above-indentified patent and that said Letters Patent is hereby corrected as shown below:

Column 20, line 10, change "signal" (second occurrence) to -- second --.

Signed and Sealed this

Twenty-second Day of March, 1994

Attest:

BRUCE LEHMAN

Attesting Officer    Commissioner of Patents and Trademarks